United States Patent [19]
Terpstra et al.

[11] Patent Number: 5,366,688
[45] Date of Patent: Nov. 22, 1994

[54] HEAT SINK AND METHOD OF FABRICATING

[75] Inventors: Robert L. Terpstra; Barbara K. Lograsso; Iver E. Anderson; Jeffrey A. Moore, all of Ames, Iowa

[73] Assignee: Iowa State University Research Foundation, Inc., Ames, Iowa

[21] Appl. No.: 208,809

[22] Filed: Mar. 10, 1994

Related U.S. Application Data

[63] Continuation of Ser. No. 988,217, Dec. 9, 1992, abandoned.

[51] Int. Cl.$^5$ .............................................. B22F 3/16
[52] U.S. Cl. ............................... 419/36; 419/44; 419/48; 419/54; 419/55
[58] Field of Search .............. 419/36, 44, 54, 55, 419/48; 29/558; 72/254; 357/67; 361/387; 501/98

[56] References Cited

U.S. PATENT DOCUMENTS

| | | | |
|---|---|---|---|
| 4,879,891 | 11/1989 | Hinshaw | 72/254 |
| 4,884,331 | 12/1989 | Winshaw | 29/558 |
| 4,997,798 | 3/1991 | Okuno | 501/98 |
| 5,028,367 | 7/1991 | Wei | 264/63 |
| 5,045,972 | 9/1991 | Supan et al. | 361/387 |
| 5,049,184 | 9/1991 | Harner et al. | 75/246 |
| 5,310,520 | 5/1994 | Jha et al. | 419/48 |

OTHER PUBLICATIONS

H. W. Markstein, *EP&P*, Jul. 1991, Design Tips for SMT Cooling, pp. 51–55.
B. K. Lograsso, et al., *American Powder Metallurgy Institute*, vol. 25, No. 4 (1989), pp. 337–348, Injection Molding of Carbonyl Iron with Polyethylene Wax.
*EG&G Wakefield Engineering*, Deltem Composite Heat Sinks Introduce a New Dimension to Electronics Heat Transfer (Advertisement, Jun. 1989).
B. K. Lograsso, R. M. German, *Powder Metallurgy Int'l*, vol. 22, No. 1 (1990), Thermal Debinding of Injection Molded Powder Compacts.

*Primary Examiner*—Donald P. Walsh
*Assistant Examiner*—John N. Greaves
*Attorney, Agent, or Firm*—Flehr, Hohbach, Test, Albritton & Herbert

[57] ABSTRACT

A heat sink composed of metal particles dispersed in a binder or a sintered structure in which the binder is removed; and the method of forming a heat sink by molding the heat sink from a thermoplastic or epoxy material which has been filled with metal particles.

14 Claims, 9 Drawing Sheets

HEAT SINK AND METHOD OF FABRICATING

This is a continuation of application Ser. No. 07/988,217 filed Dec. 9, 1992, now abandoned.

BRIEF DESCRIPTION OF THE INVENTION

This invention relates generally to a heat sink and method of fabrication, and more particularly to an injection-molded thermally conductive heat sink and method of fabrication.

BACKGROUND OF THE INVENTION

Excessive heat developed during operation of integrated circuits and particularly very large integrated circuits such as microprocessors, controllers and other high performance electronic logic devices can drastically reduce the reliability and efficiency of the circuit. Finding adequate methods to remove the excess heat has become a very important design parameter in building high performance electronic circuitry.

Many different approaches have been taken to disperse the excess heat that is generated in electronic circuits. One of the most common ways to dissipate the heat is through the use of heat sinks fabricated from extruded aluminum, but aluminum heat sinks have certain physical design limits. One limitation is the shape, which is limited to simple two-dimensional profile shapes that can be extruded. This reduces the potential for size reduction and the development of complex shapes to increase the convective and radiant cooling efficiency of the heat sink.

A new type of heat sink is constructed of filled polymer material that can be injection-molded into a variety of compact, complex shapes which are highly efficient for convective cooling with high velocity forced air. Although the filled polymer material has only about two percent of the thermal conductivity of pure aluminum, these complex-shaped devices have a cooling capacity that is comparable to bulky aluminum heat sinks that cannot fit in a compact, forced convection environment.

To install aluminum or polymer heat sinks, they must be mounted to the device that is to be cooled. This bond is usually accomplished by using mechanical fasteners, compressible pads, silicone grease or conductive epoxies. Solder cannot be used. A major thermal management problem with bonding of these existing heat sinks is a reduction in thermal conductivity across the bond. Also any voids or gaps between the two joint surfaces can easily go undetected and can greatly reduce the thermal efficiency of the joint area.

Other heat sink approaches, for example, use liquid-filled pouches or copper-covered sponges compressed between the printed circuit board components and the outside casing of the instrument to transport the heat away from the heat source. However, these heat sinks greatly restrict the airflow through and around the printed circuit board and related chips. As a result, they appear to be limited to only special applications.

SUMMARY OF THE INVENTION

Accordingly, it is a general object of this invention to provide a new type of heat sink capable of dissipating the increasing heat loads of advanced integrated circuitry with improved efficiency and versatility.

It is another object of the invention to provide an improved injection-molded heat sink and method of fabrication.

It is a further object of the invention to provide an injection-molded metal heat sink employing high conductivity powders fabricated in complex shapes and a method of manufacture.

It is a further object of the invention to provide heat sinks molded from a binder loaded with highly conductive powders.

It is a further object of the invention to provide an injection-molded heat sink that can be soldered to integrated circuits resulting in improved thermal conductivity across the bond between the heat sink and the circuit and in increased mechanical strength.

These and other objects of this invention are achieved by a heat sink comprising a base and extended surface means of selected shape protruding from said base comprising a molded structure comprising a binder heavily loaded with conductive particles, or such a structure in which the binder is removed and the metal particles sintered to one another. The invention is further achieved by the method of forming a heat sink by molding a mixture of a highly conductive powder and a binder into a desired heat sink shape.

BRIEF DESCRIPTION OF THE DRAWINGS

The purpose and advantages of this invention will be apparent to those skilled in the art from the following detailed description in conjunction with the appended drawings, in which.

DESCRIPTION OF PREFERRED EMBODIMENT

Generally, in accordance with this invention, highly conductive particles are mixed with a binder and the mixture is molded into the shape of the desired heat sink. The heat sink may be used in many applications as molded, that is, the heat sink comprises a thermally conductive-particle-filled binder. To provide higher conductivity, the heat sink may be processed to remove the binder and sintered to form a sintered heat sink.

The method of the invention can be used to economically produce heat sinks of desired thermal conductivity levels by appropriate selections of the initial material and particle size of the material alloy, the volume loading of the powder in the binder, and the optional post-molding procedure such as binder removal and sintering to which the molded shape may be subjected.

Figure 1:
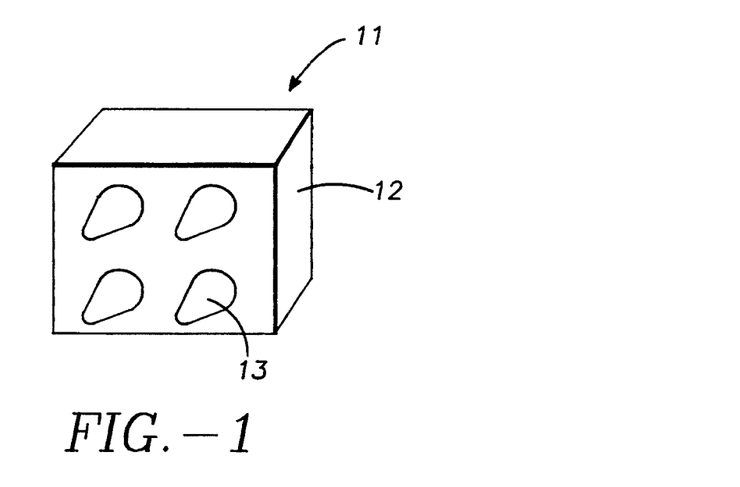
FIG. 1 is a perspective view schematically showing a heat sink including four posts.
Figure 2:
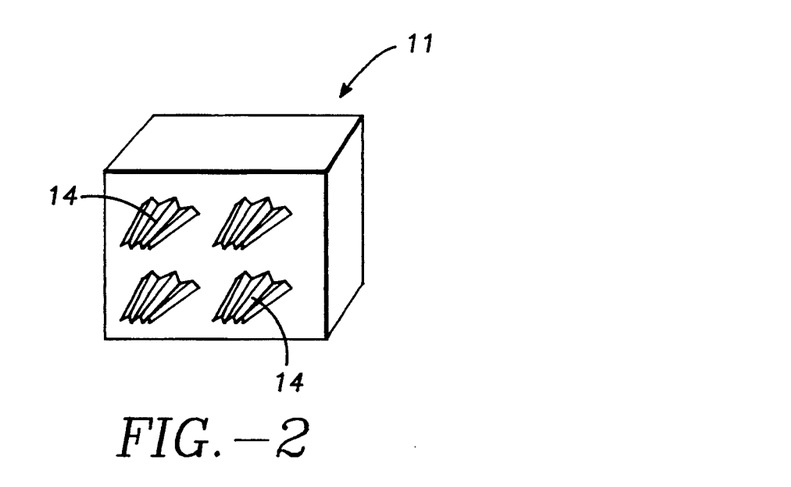
FIG. 2 is a schematic view of a heat sink with four configured posts.

FIG. 1 schematically shows a heat sink molded with heat sink 11 having a base 12 and integral outwardly projecting posts 13. This shape can be easily molded in accordance with this invention. It should, of course, be understood that this representation is only schematic and that posts having any desired configuration can be easily molded by the process of the invention. In FIG. 2, the heat sink 11 includes posts 14 which have a corrugated or shaped configuration to increase the surface area for heat transfer by radiation and conduction to the surrounds.

Figure 3:
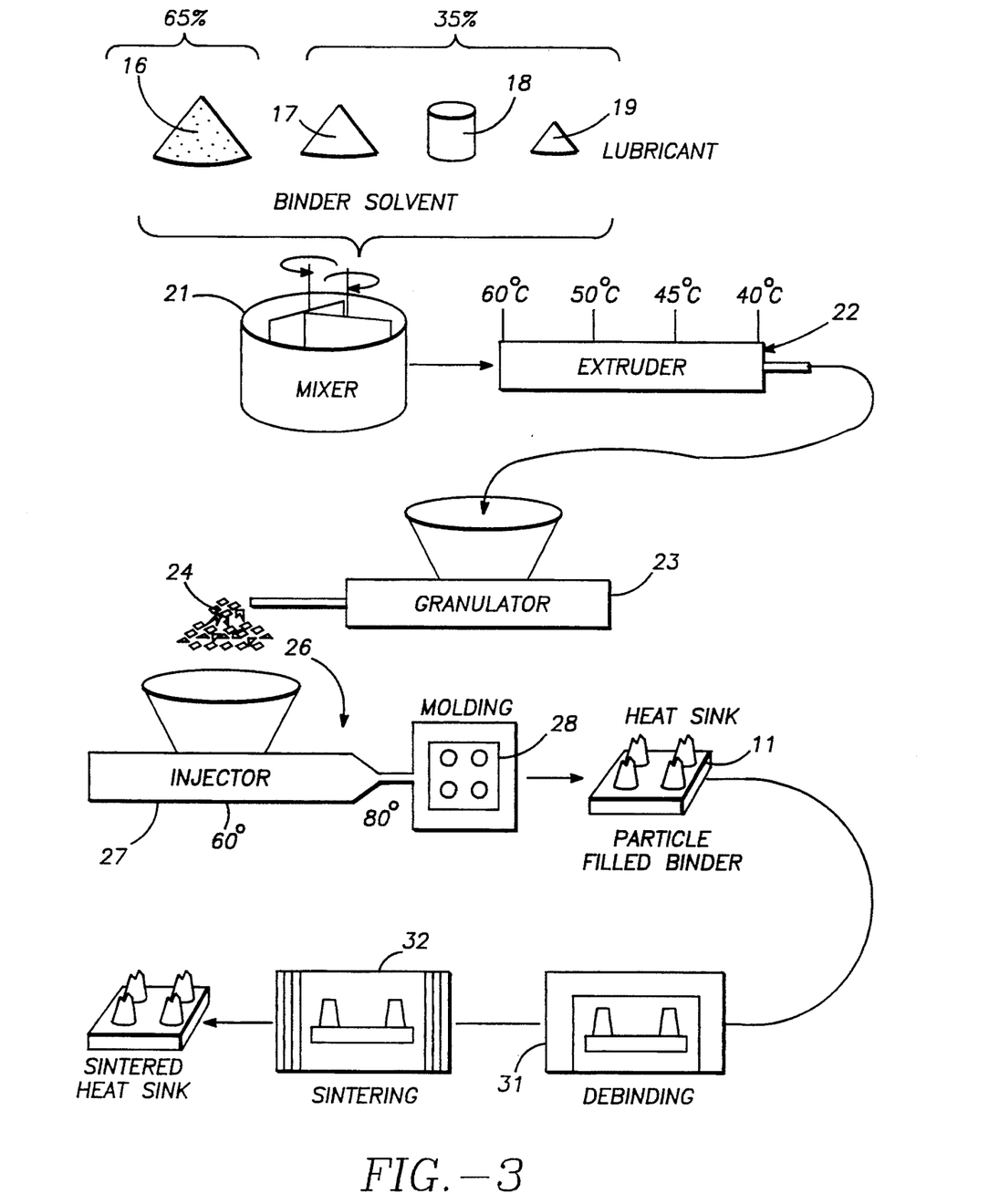
FIG. 3 is a schematic flow chart showing the fabrication of a heat sink in accordance with this invention.

Referring to FIG. 3, there is schematically illustrated the process for forming heat sinks in accordance with the present invention. As explained above, the highly conductive powder is mixed with a binder. The metal powder may be produced using inert gas, air or water atomization processes using annular-slit nozzles, close-coupled nozzles or conventional free-fall nozzles; or the metal powder may be made by other processes such as electrolytic, etc., that yield powders having the appropriate size for use in the fabrication of heat sinks. Copper, boron nitride, silver, aluminum, molybdenum, aluminum nitride, silicon carbide, silica, carbon and diamond powders are suitable for use. The particles are selected with a size distribution in the range of 0.1 to 100 microns with the preferred range for sintered heat sinks being in the range of from 0.1 to 38 microns. The thermal conductivity of the heat sink will depend primarily on the thermal conductivity of the powder. The preferred powder is copper, formed of a melt of copper electronic grade (99.99% pure) atomized by a high pressure inert gas atomization process, HPGA, of the type described by Ayers and Anderson in U.S. Pat. No. 4,619,845, the teaching of which is incorporated herein by reference. In practicing the invention, the powder particles are selected in the range of 0.1 to 38 microns. The preferred material chosen for this application is copper. Copper has extremely high thermal and electrical conductivity and is available economically in high purity ingots or bar stock. The electrical conductivity of high pressure, gas-atomized copper powder pressed to full density was essentially equal to that of electronic grade copper, corresponding to a thermal conductivity of 226 BTU/ft/hr/degree F. at 68° F. For comparison, the thermal conductivity of heat sinks comprising a polymer filled with aluminum is 3.1 BTU/ft/hr/degree F. at 68° F., and the thermal conductivity of commercial purity aluminum alloy used for heat sinks is approximately 128 BTU/ft/hr/degree F. at 68° F. Commercial purity copper powder has a slightly reduced electrical conductivity, however it is far superior to aluminum powder.

Referring to FIG. 3, the powder particles 16 are either screen-classified or air-classified so that they fall within the desired range of particle size. They are then mixed with a low viscosity binder 17, such as a thermoplastic or thermosetting polymeric binder, to provide a feedstock that can be formed or molded to desired shape under relatively low heat and pressure. The binder and alloy powder are mixed in the proportions dependent on the alloy powder used and the binder employed, as well as the desired volume loading of thermally conductive powder in the mixture. High volume loading of powder in the binder is achievable as a result of the fine spherical particles produced by high pressure inert gas atomization. For example, powder volume loading of 70–80% is possible in practicing the invention. The amount of powder depends on the thermal conductivity desired. Blends from 30 to 90 volume % copper have been found to be highly satisfactory. Blends of different particle sizes can be used to achieve optimum volume loading, whereby the smaller particles can fit in the interstices between the larger particles to provide a higher volume filling.

The low viscosity binder may be selected from certain materials which are effective to wet and bond the powder particles under the particular molding conditions involved. Binders useful in practicing this invention are generally characterized as having low viscosity. The binders may include a coupling agent such as glycerol, titanate, stearic acid, polyethylene glycol, humic acid, ethoxylated fatty acids and other known coupling agents to achieve higher loading of the powder in the binder. A preferred low viscosity binder for use in this invention comprises a mixture of high fluidity, short chain, low molecular weight components. The binder and alloy powder are typically mixed or blended by moderate to high shear mixing to provide a homogeneous, low viscosity feedstock.

Referring to FIG. 3, the binder, including a solvent 18 and a lubricant 19, if desired, and metal particles are mixed in the mixer 21 and then fed into a twin-screw extruder 22 which further mixes and extrudes the mixture. The extruder may include a plurality of heating zones, for example four zones set at 40°, 45°, 50° and 60° C., with the hottest zone at the extrusion end. After the material is extruded, it is cooled and supplied to the granulator 23 where it is ground into pellets 24. To ensure complete mixing, the process of mixing/extrusion/granulation may be repeated several times. When the mixture is completely mixed, it can then be supplied to, for example, a reciprocating screw injection molder 26. The injector 27 may have a plurality of heating zones, where the temperature at the injection end 26 of the injector is 80° C. The heated mixture is injected into a molding cavity 28. The cavity is then opened, and the heat sink 11 allowed to cool.

Figure 4:
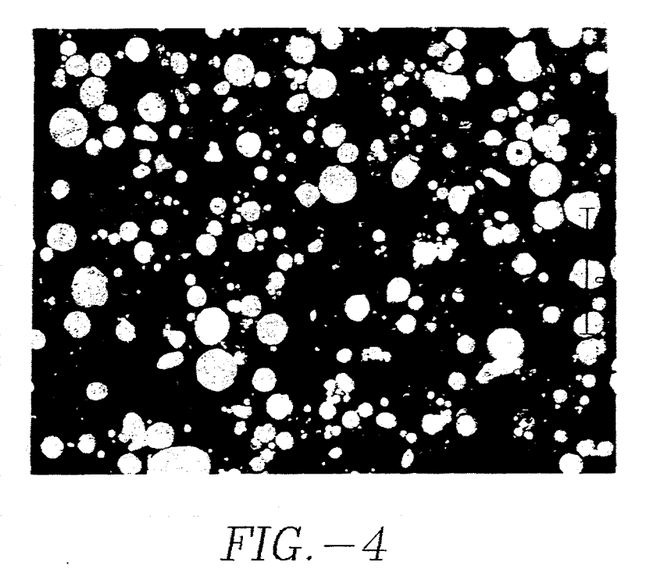
FIG. 4 is a micrograph of HPGA copper powder in epoxy at 250X magnification.
Figure 5:
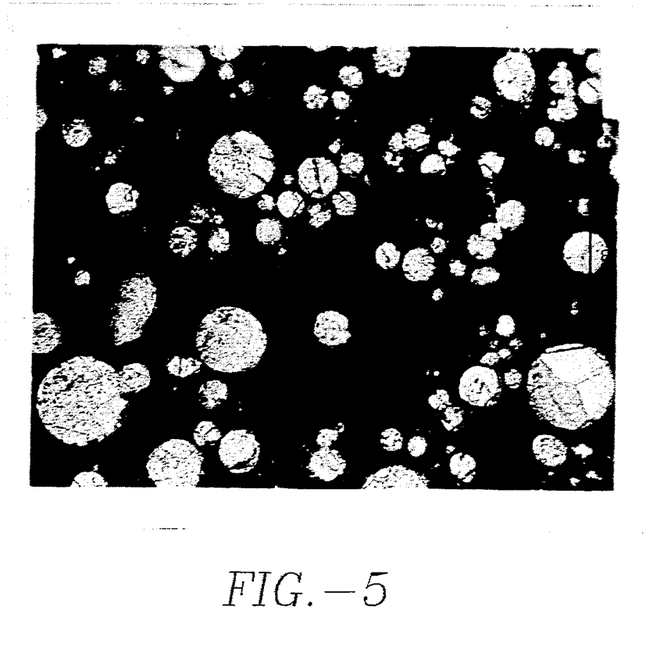
FIG. 5 is a micrograph of HPGA copper powder in epoxy and etched, shown at 500X magnification.
Figure 6:
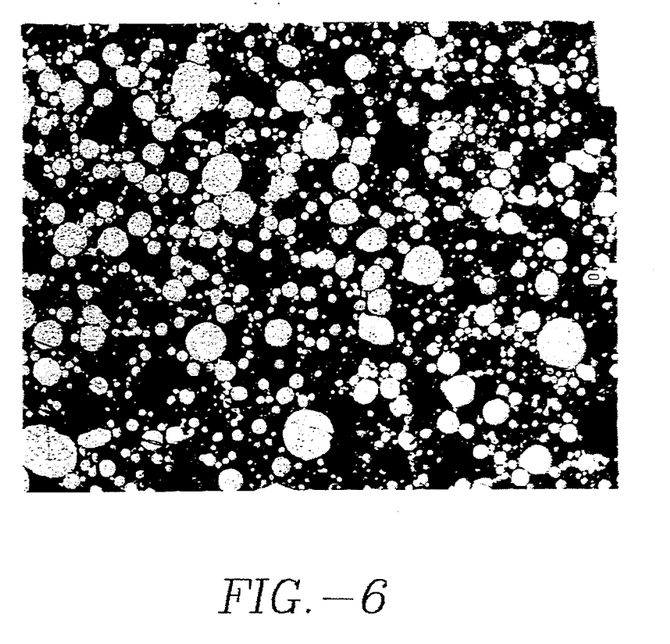
FIG. 6 is a micrograph of a heat sink which is made of 70 volume % HPGA copper powder bonded with 30 volume % phenolic, shown at 250X magnification.
Figure 7:
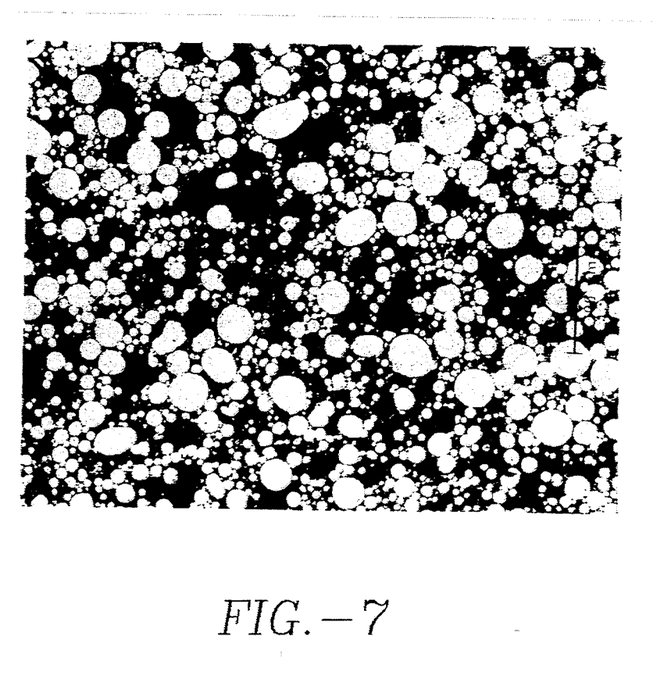
FIG. 7 is a micrograph of a heat sink which is made of 75 volume % HPGA copper powder bonded with 25 volume % phenolic, shown at 250X magnification.
Figure 8:
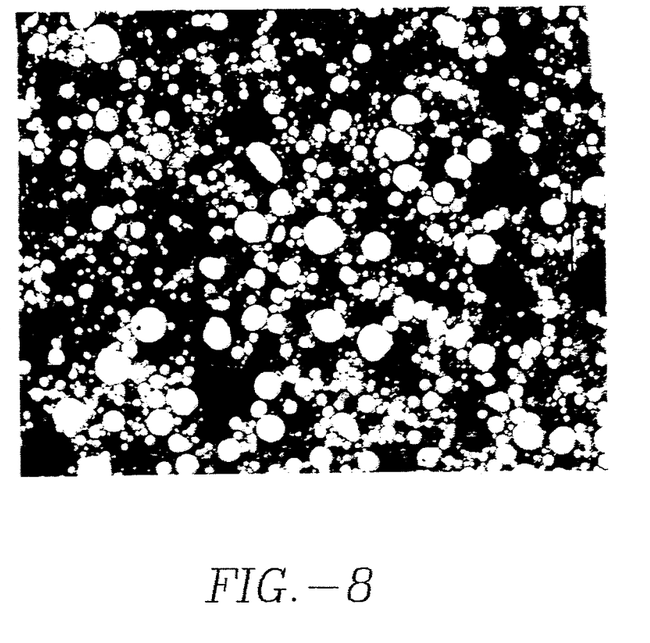
FIG. 8 is a micrograph of a heat sink which is made of 80 volume % HPGA copper powder bonded with 20 volume % phenolic, shown at 250X magnification.
Figure 9:
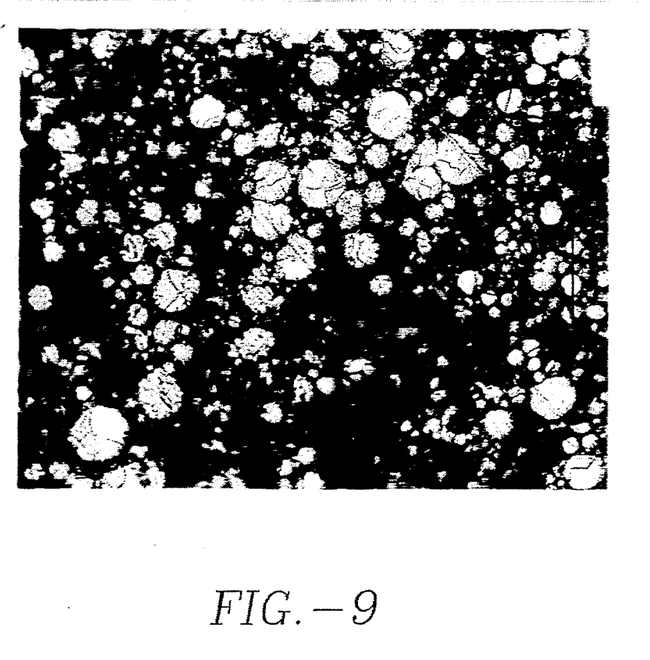
FIG. 9 is a micrograph of a heat sink which is made of 90 volume % HPGA copper powder bonded with 10 volume % phenolic, shown at 250X magnification.

As previously described, in many applications the heat sink can be used directly, as molded. Its conductivity is dependent upon the particle volume loading, particle conductivity and polymer conductivity. The thermal conductivity increases as the volume fraction of powder particles increases. Spherical powder particles are more easily molded than irregular particles at the higher volume fractions of loading; however, this does not preclude the use of irregular particles in molding applications. Non-spherical particles with a rough surface have a lower packing density and coordination number than spherical particles due to both physical constraints and particle interaction. The increased surface roughness results in interlocking of particles and greater difficulty for particles trying to slide past one another. For example, molding of the irregular copper powder was difficult with binder because of the loss of fluidity, whereas the mixture of binder with the fine spherical copper powder, FIGS. 4 and 5, was still very fluid at 60 volume %. Photo micrographs of the bonded copper heat sinks at 70 volume %, 75%, 80% and 90% powder loadings are shown in FIGS. 6, 7, 8 and 9, respectively.

If a conductivity near that of the thermally conductive particles is desired, the molded heat sink is further processed. This is accomplished by placing the ejected molded heat sink on a non-reacting substrate and loading it into a vacuum furnace 31. The binder in the heat sink is then removed by subjecting it to a heating cycle while it is under vacuum. The heat sink is progressively heated and held at temperature as, for example, the heat sink may be heated to 95° C. at 20°/hr and held at that temperature for 2 hours. The heat sink is then heated to 250° C. at the rate of 5°/hr and held for 2 hours at 258° C. The heat sink is then heated to 325° C. at a rate of 5°/hr and held for 2 hours, and then the heat sink is cooled to 20° C. as rapidly as possible, for example at 665°/hr.

The debound part is then loaded into an atmosphere controlled furnace 32 which is purged with high purity grade argon for half an hour. For the copper, after the purging the argon is turned off, the furnace is turned on, and a blend of hydrogen and helium is introduced into the furnace. For the copper example, the heat sink is heated to 1000° C. and held at that temperature for an hour with the flowing hydrogen/helium mixture. The heat sink is then cooled under flowing argon. The result is a sintered part in which the thermally conductive particles are joined to one another to provide high conductivity, near that of the pure material. Furthermore, the heat sink can be soldered directly to an associated integrated circuit.

In one example, a heat sink mold 1-inch square by approximately 1/7-inch thick with four ⅛-inch pins was used to form a heat sink of the type shown in FIG. 1. Sixty-five percent (65%) by volume copper powder and 35% by volume binder heat sinks were produced using the mixing, molding, debinding and sintering procedure set forth above. Tables 1 and 2 give the measurements of four samples of four-pin square heat sinks in the as-molded and sintered conditions. Substantially uniform dimensions are indicated. Tables 3 and 4 display the shrinkage values and percent, respectively, for the four sintered heat sinks.

TABLE 1

| | As Molded Measurements | | | |
|---|---|---|---|---|
| Sample No. | A (mm) | B (mm) | Thickness (mm) | Mass (g) |
| 1 | 25.2 | 25.2 | 3.7 | 15.1813 |
| 2 | 25.3 | 25.4 | 3.7 | 15.5261 |
| 3 | 25.2 | 25.3 | 3.7 | 14.7205 |
| 4 | 25.3 | 25.3 | 3.8 | 15.4174 |

TABLE 2

| | SINTERED AT 1000° C. FOR 1 HOUR MEASUREMENTS | | | |
|---|---|---|---|---|
| Sample No. | A (mm) | B (mm) | Thickness (mm) | Mass (g) |
| 1 | 23.2 | 23.2 | 3.4 | 14.3935 |
| 2 | 23.7 | 23.6 | 3.6 | 14.7611 |
| 3 | 23.5 | 23.6 | 3.6 | 13.9104 |
| 4 | 23.2 | 23.3 | 3.5 | 14.6488 |

TABLE 3

| | Heat Sink Shrinkage | | | |
|---|---|---|---|---|
| Sample No. | A (mm) | B (mm) | Thickness (mm) | Mass (g) |
| 1 | 2 | 2 | 0.3 | 0.7878 |
| 2 | 1.6 | 1.8 | 0.1 | 0.7650 |
| 3 | 1.7 | 1.7 | 0.1 | 0.8101 |
| 4 | 2.1 | 2 | 0.3 | 0.7686 |
| Average | 1.9 | 1.9 | 0.2 | 0.7829 |

TABLE 4

| | Heat Sink Percent Shrinkage | | | |
|---|---|---|---|---|
| Sample No. | A (%) | B (%) | Thickness (%) | Mass (%) |
| 1 | 7.94 | 7.94 | 8.11 | 5.19 |
| 2 | 6.32 | 7.09 | 2.70 | 4.93 |
| 3 | 6.75 | 6.72 | 2.70 | 5.50 |
| 4 | 8.30 | 7.91 | 7.89 | 4.99 |
| Average | 7.33 | 7.41 | 5.35 | 5.15 |

Figure 10:
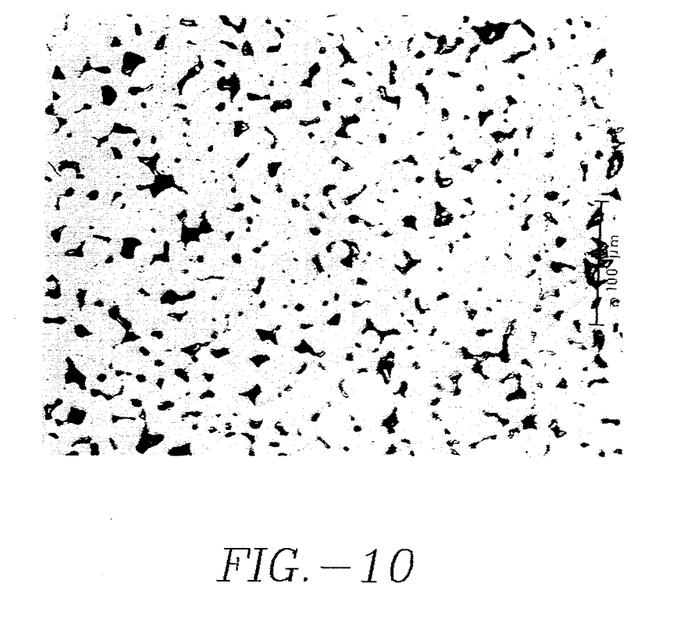
FIG. 10 is a micrograph showing the structure of a heat sink formed with binder, shown at 250X magnification.
Figure 11:
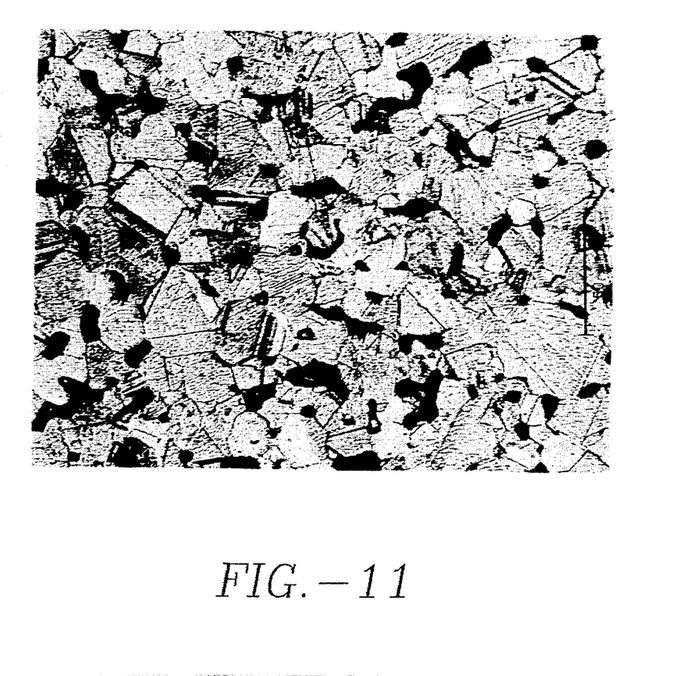
FIG. 11 is a micrograph showing the structure of the sintered heat sink of FIG. 10 after etching, shown at 500X magnification.

The average measured shrinkage for the pin heat sinks was 7.33% across the length, 7.41% across the width, 5.35% for the thickness, and 5.15% for the mass. Immersion bulk density measurements indicate that the as-molded, debound and sintered sample has 2.18, 29.92 and 13.69% open porosity, respectively. Unetched and etched cross-sections for the copper pin heat sinks are given at 250X magnification in FIGS. 10–11.

Figure 12A:
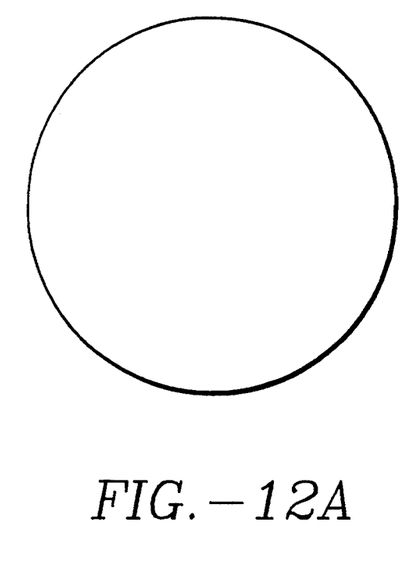
FIGS. 12A and 12B show a radial fin heat sink in plan view and side view, respectively.
Figure 12B:
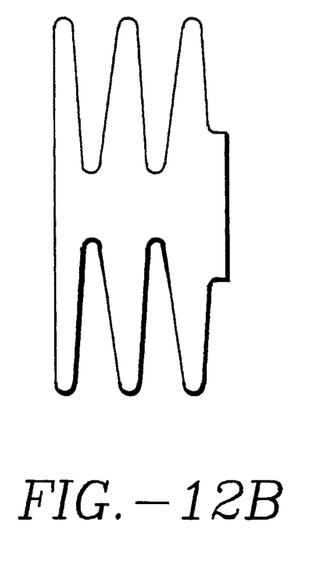
Figure 13:
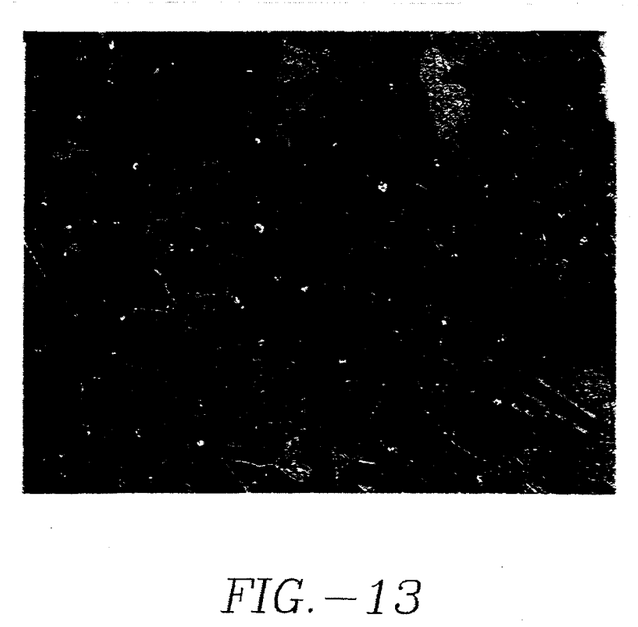
FIG. 13 is a micrograph of radial fin heat sink etched microstructure made with HPGA copper powder, shown at 250X magnification.

Several sintered heat sinks were molded with the radial fin configuration shown in FIGS. 12A–B, referred to as "hockey puck" configuration. A sintered heat sink was molded, debound and sintered to 95% density described above with copper powder made by the HPGA process. A micrograph of this heat sink, H1, is given in FIG. 13.

Figure 14:
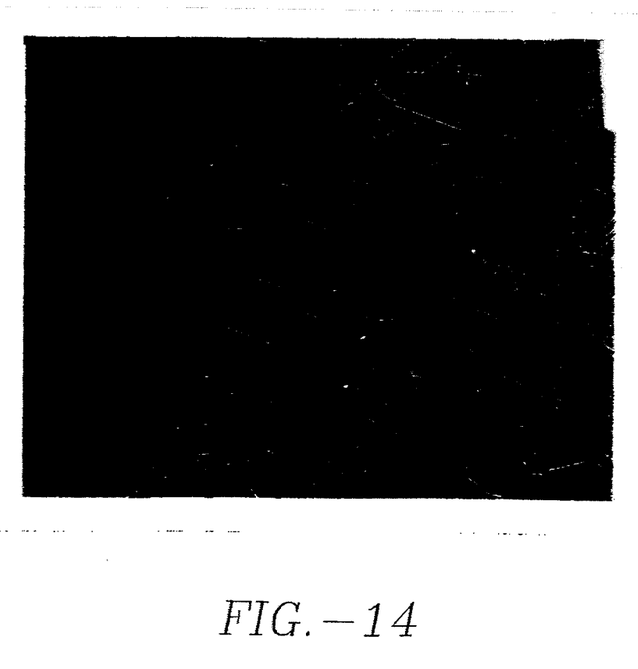
FIG. 14 is a micrograph of radial fin heat sink etched microstructure made with SCM copper powder, shown at 250X magnification.

To illustrate a comparison with commercially available powder, a second sintered heat sink was molded, debound and sintered to 95% density as described above with commercial copper powder produced by SCM Metal Products (hereinafter "SCM copper powder"). A micrograph of this heat sink, H2, is given in FIG. 14.

A bonded epoxy heat sink, H3, was molded to the radial fin shape with 60% HPGA copper powder volume % and a bonded epoxy heat sink, H4, molded to the radial fin shape with 40% SCM copper powder volume %.

Figure 15:
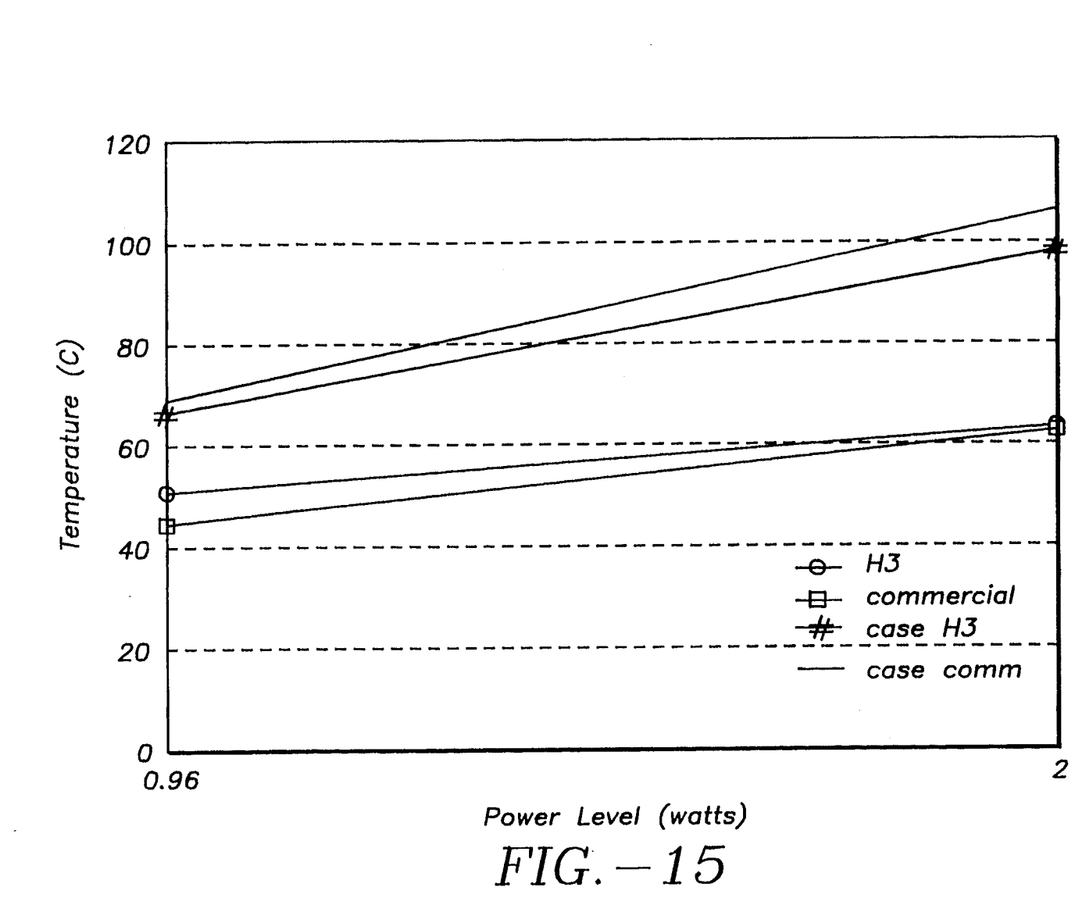
FIG. 15 shows case device and heat sink temperatures versus power level for HPGA copper H3 epoxy and commercial heat sinks.

To contrast with the performance of commercial heat sinks, FIG. 15 compares the device or case and heat sink temperatures of two heat sinks having identical dimensions, heat sink H3, and a commercial EG&G molded DELTEM D10100-28. The temperature versus power profiles suggests that the molded H3 heat sink conducts heat faster to the surface, and thus, for a given power level, has a higher heat sink temperature. As a result, the H3 heat sink provided a lower case (device) temperature than the commercial heat sink. The case and heat sink temperatures of H3, H4, H1 and H2 sintered and the commercial heat sink as a function of power level, shown as case temperature/heat sink temperature, are given in Table 5:

TABLE 5

| Power (Watts) | Case/Heat Sink Temperatuers (°C.) | | | | |
|---|---|---|---|---|---|
| | H3 | H4 | H1* | H2* | D1010028 |
| 0.96 | 66/50 | | 64/57 | 67/57 | 69/45 |
| 2.0 | 98/64 | 104/64 | 98/83 | 103/87 | 106/63 |
| 3.2 | 141/89 | 145/85 | 137/113 | 140/112 | 146/84 |

*The sintered H2 and H1 have smaller final surface areas after sintering, approximately 23 cm², compared to approximately 30 cm² for D1010028, H3 and H4.

Thus, the temperatures of the devices protected by H3 and H1 are several degrees lower than those sinked by D1010028 or the sinks made with SCM copper powder, H2 and H4.

In another example, a commercial 25 pin hat sink with a 35 cm² surface area compared to 22 cm² for H1 and 30 cm² for H3. The heat sinks made by the process of the present invention out-perform the commercial heat sinks as shown in Table 6 (case temperature/heat sink temperature).

TABLE 6

| Power | Case/Heat Sink Temperatures (°C.) | | |
|---|---|---|---|
| | H1 | H3 | Commercial |
| 0.96 | 64/57 | 66/50 | 67/42 |
| 2.0 | 98/83 | 98/64 | 104/56 |
| 3.2 | 137/113 | 141/89 | 143/71 |

To illustrate the effect of volume loading, bonded heat sinks at various powder volume fractions were prepared with dia. <15 microns HPGA copper powder and phenolic binder. These mixes were molded into single disk-shaped heat sinks with approximately 13 cm² surface area. The effect of volume fraction of HPGA copper powder is shown in Table 7 (case temperature/heat sink temperature).

TABLE 7

| Power (Watts) | Case/Heat Sink Temperatures (°C.) for (vol % HPGA Copper/vol % binder) | | | | | |
|---|---|---|---|---|---|---|
| | (30/70) | (40/60) | (50/50) | (60/40) | (70/30) | (90/10) |
| 1.11 | 73/44 | 72/43 | 66/44 | 67/43 | | |
| 1.3 | | | | | 80/59 | 75/64 |
| 1.8 | 99/51 | 94/56 | 90/57 | 93/55 | | |
| 2.1 | | | | | 109/73 | 101/81 |
| 3.2 | | 142/89 | | | 145/92 | 132/102 |

Thus, there has been provided a heat sink which can be molded into desired shapes from a highly thermal conductive material comprising metal particles dispersed in a binder. The heat sink can be used with the binder in place, or it may be sintered to provide a substantially metallic heat sink.

What is claimed:

1. The method of fabricating a heat sink comprising the steps of selecting a thermally conductive material having a high conductivity and selecting a powder of the thermally conductive material which has a high packing density, mixing particles of the powder with a polymer binder to form a particle/binder mixture, heating the mixture to melt the polymer binder in the particle/binder mixture and molding the mixture into a heat sink having the desired shape and size, allowing the heat sink to cool, debinding the molded heat sink to remove the polymer binder by positioning the heat sink in a vacuum environment and progressively heating the heat sink, and processing the debound heat sink to form interparticle metallurgical bonds between adjacent particles of the powder.

2. The method of claim 1 in which the selected thermally conductive material is copper.

3. The method of claim 1 in which the thermally conductive material is one selected from the group comprising copper, silver, aluminum, molybdenum, aluminum nitride, silicon carbide, boron nitride, quartz, carbon and diamond.

4. The method of claims 1, 2 or 3 in which the mixture is molded by injection molding.

5. The method of claims 1, 2 or 3 in which the step of processing the debound heat sink includes sintering the debound heat sink.

6. The method of fabricating a heat sink comprising the steps of selecting a thermally conductive material having high conductivity and selecting a powder of the thermally conductive material having a high packing density, mixing the powder with a binder to form a powder/binder mixture, molding the mixture into a heat sink having the desired shape and size, removing the polymer binder from the heat sink by positioning the heat sink in a vacuum environment and progressively heating the molded heat sink to a plurality of selected temperatures with the heat sink being subjected to each selected temperature for a selected time interval, and heating the debound heat sink to sinter the powder.

7. The method as in claim 6 in which the thermally conductive material is one selected from the group comprising copper, silver, aluminum, aluminum nitride, silicon carbide, carbon and diamond.

8. The method as in claim 7 in which the volume percent of the powder in the powder binder mixture is between 30 and 90.

9. The method as in claim 8 in which the size of the powder is selected to fall in the range of 0.1 to 100 microns.

10. The method as in claim 8 in which the size of the powder is selected to be in the range of 0.1 to 38 microns.

11. A heat sink having a base and extended surface means comprising sintered particles of a thermally conductive material, said heat sink having a continuous microstructure and a thermal conductivity substantially similar to the thermal conductivity of a sample of the thermally conductive material.

12. A heat sink as in claim 11 in which the thermally conductive material is one selected from the group comprising copper, silver, aluminum, molybdenum, aluminum nitride, silicon carbide, carbon and diamond.

13. The method of claim 6 in which the selected thermally conductive material is a metal.

14. The method of claim 13 in which the metal is copper.

* * * * *